United States Patent [19]

Tseng et al.

[11] Patent Number: 5,685,947

[45] Date of Patent: Nov. 11, 1997

[54] CHEMICAL-MECHANICAL POLISHING WITH AN EMBEDDED ABRASIVE

[75] Inventors: Huan Chi Tseng; Ying-Chen Chao, both of Hsin-Chu, Taiwan

[73] Assignee: Taiwan Semiconductor Manufacturing Company Ltd., Hsin-Chu, Taiwan

[21] Appl. No.: 510,827

[22] Filed: Aug. 3, 1995

[51] Int. Cl.⁶ .................................................. H01L 21/461
[52] U.S. Cl. .................................... 156/636.1; 156/645.1; 216/88; 216/89; 451/41
[58] Field of Search ........................ 156/636.1, 642.1, 156/645.1; 216/88, 89; 437/225; 451/41

[56] References Cited

U.S. PATENT DOCUMENTS

| | | | |
|---|---|---|---|
| 5,302,233 | 4/1994 | Kim et al. ........................... | 156/636.1 |
| 5,318,927 | 6/1994 | Sandhu et al. ...................... | 437/225 |
| 5,468,682 | 11/1995 | Homma ............................. | 437/195 |
| 5,575,886 | 11/1996 | Murase ............................. | 156/636.1 |

Primary Examiner—R. Bruce Breneman
Assistant Examiner—Michael E. Adjodha
Attorney, Agent, or Firm—George O. Saile; Stephen B. Ackerman

[57] ABSTRACT

A chemical-mechanical polishing process is described that provides high etch rates while at the same time minimizing the consumption of abrasives. This is achieved by embedding and dispersing the abrasive within the body of the material that is to be subjected to chemical-mechanical polishing.

13 Claims, 2 Drawing Sheets

CHEMICAL-MECHANICAL POLISHING WITH AN EMBEDDED ABRASIVE

BACKGROUND OF THE INVENTION

1. Field of the Invention

The invention relates to the field of Chemical-Mechanical Polishing and its application to Integrated Circuit technology, particularly the planarization process.

2. Description of the Prior Art

In integrated circuit technology, the removal of various layers is usually accomplished through use of liquid or gaseous etchants. In these cases, the reaction products are fluids that are readily removed from the reaction site so that etching can proceed at a uniform rate. In certain cases, however, the reaction products are insoluble solids that are, at best, hard to remove. At worst, the etchant serves only to undermine, or weaken, the layer's integrity near the surface and, in the absence of any other action, are thus quite ineffective as etchants.

In etching situations of this sort, mechanical assistance in the form of a slurry comprising an abrasive powder suspended in a suitable liquid medium (such as the etchant itself) can be used to complement the action of the chemical etchant. This technique for removing material through a combination of chemical and mechanical means is referred to as Chemical Mechanical Polishing (CMP).

While CMP makes possible the controlled removal of materials that could not be effectively removed in any other way, it tends to be slow unless relatively large amounts of slurry are used throughout the process. For example, Kim et al. in U.S. Pat. No. 5,302,233 (Apr. 12, 1994) provide the following data for a layer of tetraethyl orthosilicate, between 2 and 6,000 Angstrom units thick, rotated at between 5 and 50 RPM:

| SLURRY USAGE (cc./min.) | ETCH RATE (Angstroms/min.) |
| --- | --- |
| 20 | 100 |
| 200 | 4,000 |

Thus, in order to obtain useful etch rates, particularly for production applications, substantial amounts of slurry must be used. Furthermore, recovery of used slurry is not economically feasible so, in CMP, the cost of the slurry becomes an important consideration. To the best of our knowledge, this particular aspect of CMP has not been addressed till now.

Both Kim et al. (referred to above) and Sandhu et al. (U.S. Pat. No. 5,318,927 Jun. 7, 1994) describe CMP processes but in neither case is any solution offered to the problem of the high cost of slurry—particularly if high etch rates are to be achieved.

SUMMARY OF THE INVENTION

It is an object of the present invention to provide a CMP process that uses a minimum amount of abrasive slurry material while at the same time providing a high etch rate.

This has been achieved by embedding the abrasive within the body of the material that is to be removed, thereby providing a steady supply of abrasive at exactly the correct place and time, with no wastage of abrasive.

DESCRIPTION OF THE PREFERRED EMBODIMENTS

Our primary application of the present invention has been as a means for planarizing the surface of an integrated circuit. As integrated circuits get built up, layer by layer, the surface becomes increasingly less planar. Eventually, this lack of planarity makes photolithography ineffective since sharp images can no longer be projected onto the surface for the purpose of creating in situ masks. At this point a planarizing step becomes mandatory. A low melting point material is deposited on the surface of the integrated circuit and heated till it flows, thereby finding its own level, filling in the voids and producing a level surface. Alternatively, the material may initially be liquid at room temperature and be converted to a solid by heating. Either way, after being returned to room temperature the solid material must now be etched back, either completely or to whatever thickness the manufacturing process requires at this stage. One method for achieving this etch back is CMP.

Figure 1:
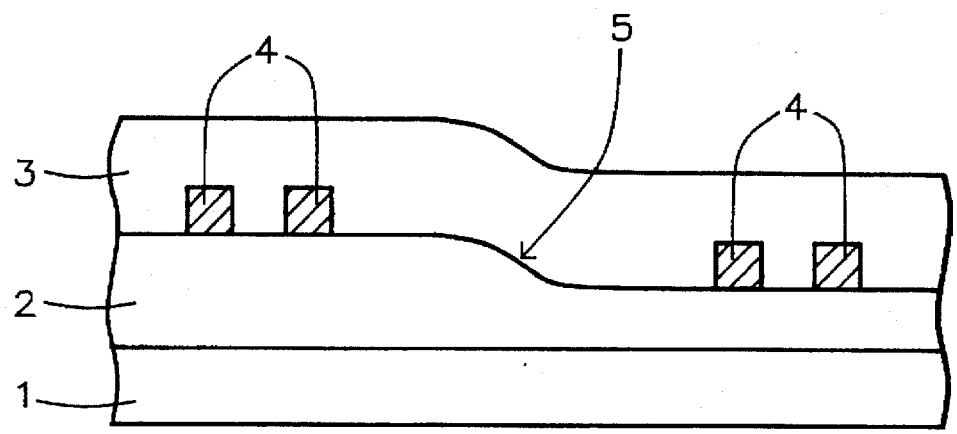
FIG. 1 is a cross-section of an integrated circuit having a non-planar surface.

Referring now to FIG. 1, we show, in schematic cross-section, a portion of a partially completed integrated circuit. A series of layers, shown as 2, has been deposited onto silicon substrate 1 resulting in an upper surface 5 that is non-planar. In addition, a number of lines, such as 4, conductors of aluminum and/or polysilicon, have also been deposited onto surface 5, further increasing the degree of non-planarity. The structure has also received a passivation coating 3 whose contours follow that of surface 5. Since FIG. 1 is for illustrative purposes only, it does not reflect the non-planarity that is additionally introduced by lines such as 4.

Figure 2:
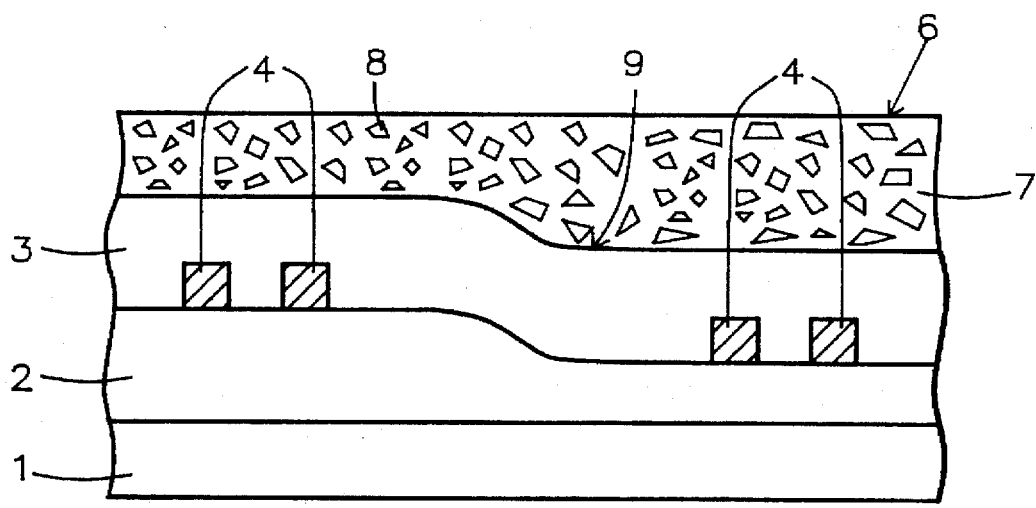
FIG. 2 shows the addition of a planarizing layer in which abrasive particles have been embedded and dispersed.

The planarization process begins with the deposition of layer 7 as shown in FIG. 2. Note the presence of abrasive particles such as 8, that have been uniformly dispersed within and throughout 7. Our preferred choice of material for layer 7 has been a spin-on glass (SOG) with embedded particles of silicon oxide. Fused silica particles are dispersed in with the SOG and its solvent. The SOG is then applied to the wafer through spin coating at about 4,000 RPM to form a uniform layer, following which it is cured by heating at 370° C. for about 30 minutes.

It should be noted that the invention would work equally well with similar materials such as glass formed by Atmospheric Pressure Chemical Vapor Deposition (APCVD) in which air-borne particles had been trapped. After deposition, layer 7 would be heated to around 370° C. for about 30 minutes so that sufficient reflow occurred for voids in surface 9 to be filled in and for upper surface 6 to become level.

In this particular embodiment of the present invention the abrasive particles comprised fused silica formed through the hydrolysis of very pure chlorosilane in an oxy-hydrogen flame at about 1,800° C. Said particles have an average particle size that is less than about $3 \times 10^{-2}$ microns. The abrasive was introduced into the material that comprised layer 7 by mixing it with the SOG in the SOG container.

Figure 3:
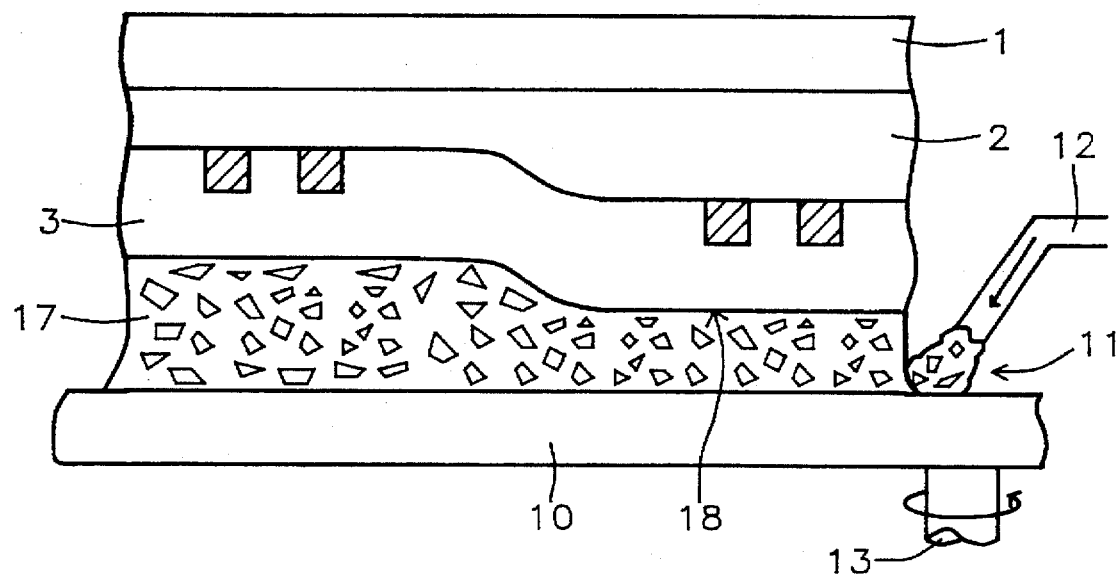
FIG. 3 shows the structure being polished by rotating it relative to a grinding pad.

Referring now to FIG. 3, the structure shown in FIG. 2 has been inverted and pressed against grinding pad 10 which includes rotational means 13. It is also possible for the structure to rotate independently about its own axis (means for achieving this not shown). Dispenser 12 delivers polish solvent (chemical etchant) 11 at a point where it can flow evenly between the surface of the structure and the grinding pad. For this embodiment we have used Rippey's SC-1, diluted 2 to 1, as the polish solvent but other polish solvents, such as Rippey's 56-25 and Rodel's ILD-1300, could also be used.

Note that although dispenser 12 in FIG. 3 supplies only pure etchant, abrasive particles will be released from within layer 7 (shown as 17 in the figure) as it erodes. These released particles of abrasive make their appearance exactly where they are needed for the CMP to proceed at exactly the time that they are needed. Thus, the use of abrasive has been optimized and the cost of doing CMP has been minimized. It will be seen that as layer 17 grows ever thinner a point will be reached when a portion of it has been completely removed. For example, when surface 18 becomes exposed. At that point, the etch rate due to CMP is likely to become too low for CMP to continue to be effective. If so, it will be necessary to begin including abrasive particles within liquid 11 as dispensed by dispenser 12. Typically, the introduction of abrasive particles into the etchant stream would be timed to begin when the etch rate has fallen below about 900 Angstrom units per minute.

Figure 4:
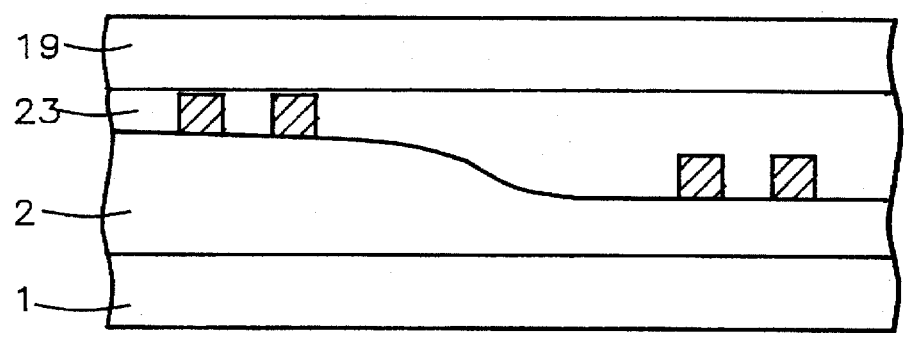
FIG. 4 illustrates the finished product.

FIG. 4 shows the structure at the conclusion of the planarization process. The upper surface of layer 23 (formerly layer 3 in the earlier figures) is now completely planar and additional layers, such as 19, can now be added and subjected to photolithography, as needed.

Example I, below, illustrates the effectiveness of the present invention over our earlier practice:

| ETCH RATE Angstroms/minute | AMOUNT OF ABRASIVE CONSUMED | |
| --- | --- | --- |
| | slurry method ml/min. | embedded abrasive ml/min. |
| 4,000 | 200 | 100 |

The layer being removed comprised PE-TEOS. The total area was approx. 170 sq. cm. and the abrasive powder comprised fused silica. The polish solvent comprised diluted Rippey's SC-1 applied at a pressure of 8 PSI at a carrier speed of 60 RPM and a platten speed of 40 RPM.

EXAMPLE I

It should be noted that, although in this embodiment of the present invention the layer in which the abrasive particles were embedded was completely removed by CMP, in other applications of the present invention it may be desireable to leave a portion of said layer in place. In some cases the presence of abrasive particles within the layer could make it unsuitable for further use, but not necessarily in all cases. Thus, while the invention has been particularly shown and described with reference to this preferred embodiment, it will be understood by those skilled in the art that various changes in form and details may be made without departing from the spirit and scope of the invention.

What is claimed is:

1. A process for chemical-mechanical polishing comprising:

providing a substrate;

coating said substrate with a layer of a dielectric material that includes an abrasive powder embedded and dispersed therein;

providing a grinding pad;

providing a polish solvent;

dispensing said polish solvent so that it flows between said substrate and said grinding pad; and pressing the coated surface of said substrate against the surface of said grinding pad while at the same time rotating said substrate relative to said grinding pad.

2. The process of claim 1 wherein said abrasive powder is taken from the group consisting of cabosil, fused silica, and airborne silica particles and has a particle size that is less than about $3 \times 10^{-2}$ micron.

3. The process of claim I wherein said polish solvent is taken from the group consisting of diluted Rippey's SC-1, Rippey's SS-25, and ILD-1300.

4. The process of claim 1 wherein said grinding pad and said substrate rotate about independent axes.

5. The process of claim 1 wherein said substrate is a semiconductor wafer comprising an integrated circuit.

6. The process of claim 1 wherein said abrasive powder is dispersed within said material prior to the application of said material to said substrate.

7. The process of claim 1 wherein said abrasive dispersed within said material at the same time that said powder is material is applied to said substrate.

8. The process of claim 1 wherein said layer of a dielectric material is a Spin-on-Glass or Oxide deposited through Atmospheric Pressure Chemical Vapor Deposition.

9. A method for planarizing the surface of a semiconductor integrated circuit comprising:

coating the surface of said integrated circuit with a layer of a dielectric material that includes an abrasive powder embedded and dispersed therein;

providing a grinding pad;

providing a polish solvent;

dispensing said polish solvent so that it flows between said integrated circuit and said grinding pad;

pressing the coated surface of said integrated circuit against the surface of said grinding pad while at the same time rotating said integrated circuit relative to said grinding pad, thereby gradually etching away said dielectric layer; and continuing said etching until said dielectric layer has been removed, including said imbedded abrasive powder.

10. The method of claim 9 wherein said abrasive powder is taken from the group consisting of cabosil, fused silica, and airborne silica particles and has a particle size that is less than about $3 \times 10^{-2}$ micron.

11. The method of claim 9 wherein said polish solvent is taken from the group consisting of diluted Rippey's SC-1, Rippey's SS-25, and ILD-1300.

12. The method of claim 9 wherein said dielectric is a Spin-on-Glass or Oxide deposited through Atmospheric Pressure Chemical Vapor Deposition.

13. The method of claim 9 further comprising:

adding abrasive powder to said dispensed polish solvent when the etch rate falls below a value between about 800 and 1,000 Angstrom units per minute.

\* \* \* \* \*